United States Patent [19]

Chu et al.

[11] 4,235,494
[45] Nov. 25, 1980

[54] DATA PROCESSOR ENCLOSURE WITH TAMBOUR DOOR

[75] Inventors: Richard C. Chu, Poughkeepsie; James J. LaDue, Wappingers Falls; Clifford I. Shelkofsky, Poughkeepsie, all of N.Y.

[73] Assignee: International Business Machines Corporation, Armonk, N.Y.

[21] Appl. No.: 972,767

[22] Filed: Dec. 26, 1978

[51] Int. Cl.² .......................... E06B 9/14; A47N 1/00
[52] U.S. Cl. .................................. 312/297; 312/223; 160/25
[58] Field of Search ............... 312/297, 190, 222, 295, 312/223, 209, 138 R, DIG. 33; 160/117, 118, 25

[56] References Cited

U.S. PATENT DOCUMENTS

| 323,734 | 4/1943 | Becker | 312/190 |
|---|---|---|---|
| 1,733,935 | 10/1929 | Blackstone | 312/223 |
| 2,235,573 | 3/1941 | Derman | 312/297 |
| 3,020,951 | 2/1962 | Graulich | 160/117 |
| 3,092,170 | 6/1963 | Ellis | 160/26 |
| 3,110,533 | 11/1963 | Le Bron | 312/222 |
| 3,126,022 | 3/1964 | Thompson | 312/223 |
| 3,215,482 | 11/1965 | Litke | 312/223 |
| 3,348,799 | 10/1967 | Junkel et al. | 312/209 |
| 3,837,041 | 9/1974 | Modert et al. | 312/297 |
| 3,936,113 | 2/1976 | Anderson | 312/297 |

FOREIGN PATENT DOCUMENTS

| 212520 | 5/1960 | Austria | 312/297 |
|---|---|---|---|
| 303335 | 11/1916 | Fed. Rep. of Germany | 160/26 |
| 557145 | 8/1923 | France | 160/26 |
| 1092099 | 4/1955 | France | 160/26 |
| 1363616 | 5/1964 | France | 312/297 |
| 503928 | 12/1954 | Italy | 312/297 |
| 877222 | 9/1961 | United Kingdom | 312/297 |
| 1011579 | 12/1965 | United Kingdom | 312/297 |
| 1239943 | 7/1971 | United Kingdom | 312/297 |

Primary Examiner—Victor N. Sakran
Attorney, Agent, or Firm—W. S. Robertson

[57] ABSTRACT

An enclosure for data processing apparatus has a tambour door that slides in a track to partially open the front of the processor enclosure. The tambour door retracts completely into a canister that has a U shaped track that carries the tambour door. The canister is hinged along one edge of the processor frame so that the canister can be swung out to permit access completely along the front of the enclosure with a minimum of interference from the door and canister and with a minimum intrusion into an aisle alongside the processor.

7 Claims, 11 Drawing Figures

DATA PROCESSOR ENCLOSURE WITH TAMBOUR DOOR

INTRODUCTION

A data processor and the associated storage and channels are made up of a number of circuit boards and components, apparatus for cooling the components, and power supplies and other supporting circuits. These components are commonly housed in generally rectangular enclosures. The enclosures conventionally have tubular metal frames and rectangular metal panels are attached to the outside of the frames. Some of these panels are hinged to permit access to the processor by service personnel.

The enclosure has several functions. The rectangular metal panels form an electromagnetic shield that isolates the components inside the enclosure from other electrical apparatus. The enclosure also helps to contain the noise of the electrical components such as fans and transformers. The cover panels may support an array of indicators and switches. Also, the covers carry a decorative outer finish.

OBJECTS OF THE INVENTION

One of the objects of this invention is to provide an enclosure that can be opened more easily for access by service personnel.

In the conventional apparatus that has been described already, some of the panels are hinged to the tubular frame so that they can be swung open for access. For example, an enclosure may have two panels along its front that are hinged at the ends of the frame to swing open. The panels are fairly wide and they intrude undesirably into the floor space alongside the processor when they are opened. Processor units are frequently arranged in columns with aisles between the columns, and it is an object of this invention to reduce the aisle space that is taken up by doors when they are swung open. This object is particularly important where doors of two processors are located oppositely across an aisle and the doors may be simultaneously opened.

Another object of this invention is to provide a processor enclosure that does not have wide, unbroken, flat surfaces. Processors are conventionally offered to customers in a range of colors. When colors are carried on unbroken flat surfaces, any slight differences in color are noticeable and are objectionable. Objectionable differences occur if covers are painted with different batches of paint, and it is conventional to paint the covers in sets. One of the objects of this invention is to provide an enclosure in which the conventional flat panels are separated by functional components of a door structure so that areas of color are broken up in a way that eliminates the undesirable effects of small differences in color. Other objects and advantages of the invention will be described later.

SUMMARY OF THE INVENTION

The processor enclosure of this invention has conventional flat panels at the top and ends but has a tambour door with vertical slats along the front and back. The tambour door may be made in two separately slideable parts, and each part slides horizontally along a track system located in part along the front (and back) edge at the top and bottom of the enclosure and in part in a track system inside a canister. The length of the track system inside the canister is slightly longer than the length of the track system outside the canister so that when the tambour door is in the closed position it projects slightly into the canister for completely closing the enclosure and when it is in the open position it is moved fully into the canister and it is free of the external track. The canister is hinged along one edge of the processor frame so that the canister can be swung outwardly when the door has been moved inside the canister.

The canister occupies considerably less floor space than the doors of the conventional process enclosure that have been described already. In addition, the canister is a continuation of the general structure of the flat panels on the end and top but the tambour door is a visually distinct structural element.

THE DRAWING

THE ENCLOSURE OF THE DRAWING

Figure 1:
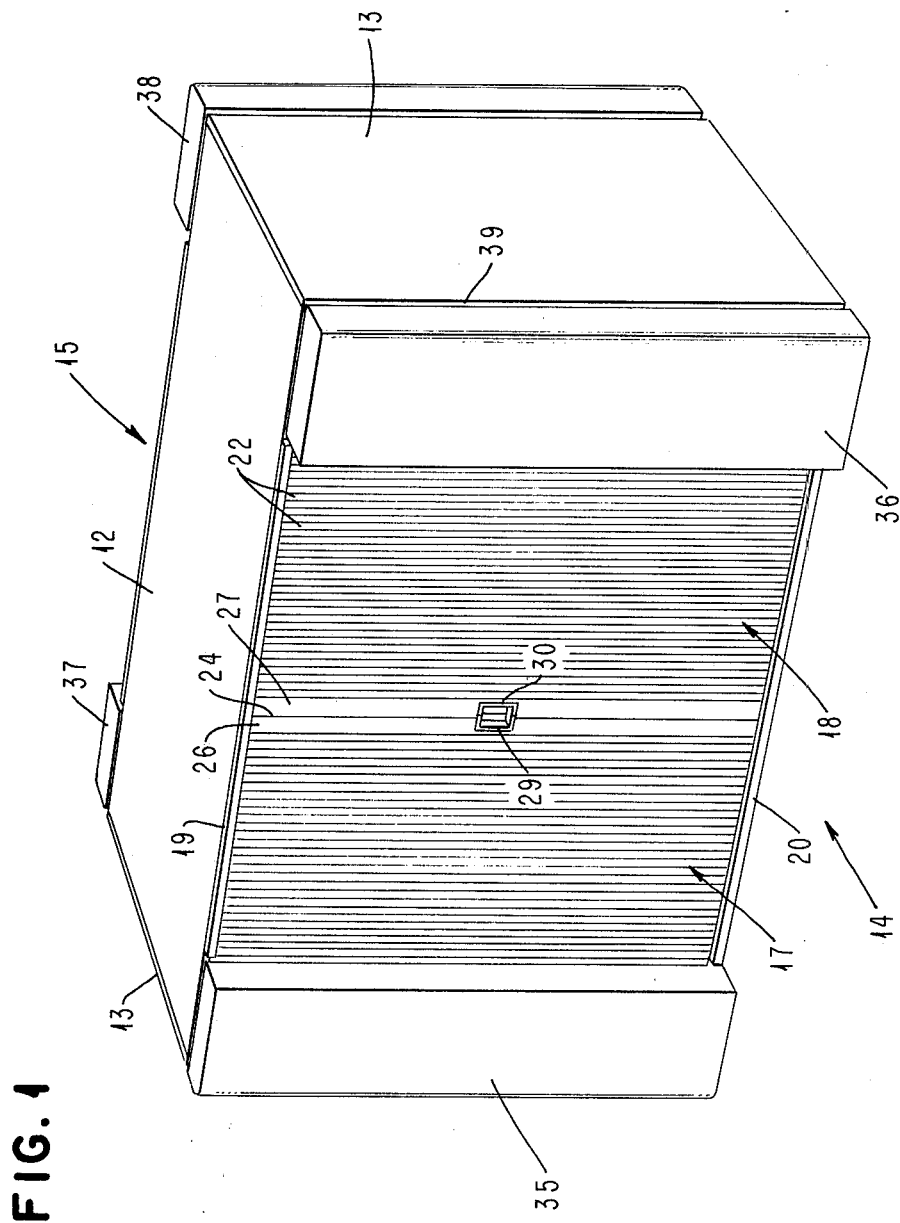
FIG. 1 is a perspective of our processor enclosure.

Introduction—FIG. 1

The rectangular perimeter of the top 12 and an end panel 13 of the enclosure of FIG. 1 will be familiar from similar arrangements of many present day processors. For reference purposes the drawing is also marked to designate a front 14 and a back 15 of the enclosure, but these terms are arbitrary and the front and back may be similar or dissimilar in structure and function. End panels 13 are conventionally made of steel and have a decorative paint finish and are attached to a tubular metal frame (not shown) that also supports components such as circuit boards and cooling apparatus. The top 12 may be an open egg crate construction. These features of the enclosure are conventional and they illustrate a variety of enclosures that can use features of this invention.

The enclosure of FIG. 1 has two tambour doors 17, 18 that slide in a track system that includes an upper track 19 and a lower track 20 that can be seen in FIG. 1. The doors are made of tambour elements or slats 22 that will be described later. The two doors meet along a line 24 and the innermost tambour elements 26, 27 may be wider than the other elements 22 and carry handles 29, 30 that are used for moving the doors along the track system. The track system has a stop (not shown) that prevents either door from being moved across the line 24. The innermost tambour elements 26, 27 carry a conventional locking mechanism to hold the door closed and one of the inner elements 26 may carry an inner flange (not shown) that overlaps the other inner element 27 to provide acoustic and electromagnetic shielding across line 24.

Canisters 35, 36 are hinged to the front edge 39 of the enclosure and are arranged to provide a U shaped section of the track system so that a door can be moved completely into its canister and the canister can be swung open to expose the interior of the processor enclosure to service personnel. A conventional latching mechanism (not shown) is provided for latching a canister to the frame of the enclosure. The control for the latch may be incorporated in the handle 29, 30 or the latch control can be located inside the enclosure at a convenient point that is accessible when the tambour door has been opened. The canisters and the tambour door are sufficiently compact and lightweight that they may be arranged to be removed if additional access space is required. In the enclosure of the drawing, a canister covers about one-sixth of the enclosure front and the associated door covers about two-thirds. The canister is only a few inches thick. Thus, when the doors are moved into the canister and the canister is swung open, the enclosure is open along its front and the canister projects only a short distance into the aisle in front of the enclosure and only slightly into the space at either end of the enclosure.

As FIG. 1 shows, similar tambour doors with canisters 37, 38 can be located at the back of the enclosure. A variety of other configurations will be apparent from FIG. 1. For example, an enclosure can be only half the length of the enclosure of FIG. 1 with a single canister and door along the front and/or back and with the open end of the door 26 or 27 latching with a mechanism carried by the conventional end wall 13. Similarly, an enclosure of about three-fourths the length of the enclosure of FIG. 1 can have a single wider door and a single wider canister and the open end of the door can close against the structure of an end panel 13 or against an inside corner of another enclosure unit when two rectangular enclosures are combined in T or L shapes.

Figure 2:
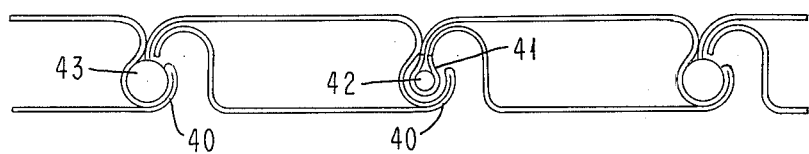
FIG. 2 is a top view of the tambour elements of a door of the enclosure.

The Tambour Door Fig. 2

Tambour doors are well known and a variety of tambour elements or slats are suitable for the enclosure of FIG. 1. The principal requirements for a door for a data processor enclosure are that the door itself is conductive and that the conductive elements of the door are electrically connected to other components of the frame of the enclosure. For example, the tambour elements can be made of metal or other conductive material or they can be painted with conductive paint or backed by a metal foil or screen.

FIG. 2 shows a top view of the preferred tambour element. Each element is formed by a conventional process in which a flat strip of steel is progressively rolled into the shape shown in FIG. 2 with the edges joined along a flat inner surface. As the door is oriented in FIG. 3, the outer surface of the door is lowermost in the drawing and the inner surface of the door is uppermost in the drawing. The tambour elements are generally rectangular tubes with a matching hinged structure at each end. Along the right hand edge of each element a portion 40 is folded into a partial cylinder that forms the outer element of a hinge. Along the left hand edge of each element a portion 41 is initially formed in a cylindrical shape about a supporting pin 42 to from the inner element of the hinge. The tambour elements can be assembled by sliding a portion 41 into a portion 40. At the upper and lower edges of the tambour elements, the cylindrical portion 41 and the pin 42 are cut away and they are replaced by a short pin 43 that is swaged or otherwise attached to portion 40 to lock the elements vertically.

Figure 3:
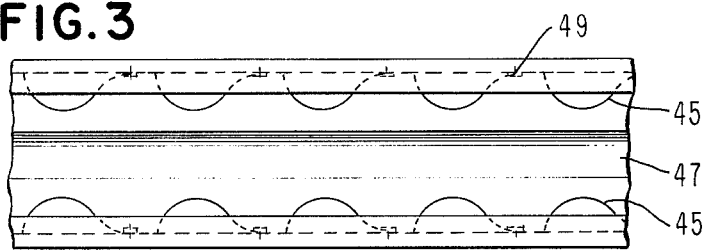
FIG. 3 is a top view of a portion of a track system supporting the door.
Figure 6:
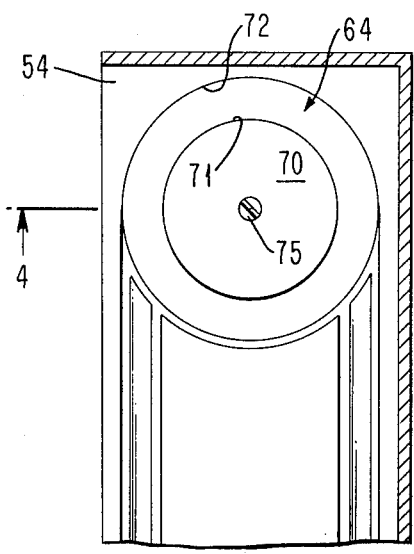
FIG. 6 is a plan view of the floor of the canister.
Figure 4:
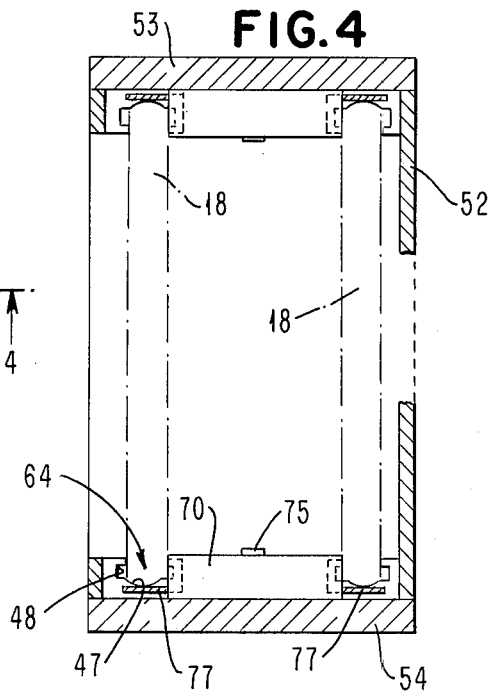
FIG. 4 is an elevation and section of a canister that is also shown in FIG. 1 taken along line 4—4 of FIG. 6.

The Fixed Track System—FIGS. 3 and 4

The upper and lower tracks 19, 20 that are shown in FIG. 1 are generally similar and it will simplify the following description to refer only to the lower track 20. FIG. 3 shows the lower track viewed from the top and FIG. 4 is an end view of the track in combination with other components. The lower track 20 supports the doors 17, 18 laterally and vertically and the upper track 19 supports the doors laterally. In addition, the tracks 19, 20 are constructed to provide electrical shielding between the upper and lower edges of the door and the corresponding edges of the enclosure. Additionally, the track carries a metal spring 45 in FIG. 3 that makes sliding electrical contact with the tambour doors to keep the door at the electrical potential of the frame.

As can be seen in FIGS. 3 and 4, the lower track 20 is generally channel shaped with a groove 47 that helps to center the door in the track and with a suitable configuration 48 for receiving the contact making spring 45. Spring 45 is connected electrically and mechanically to the channel by means 49 such as screws. These components illustrate a variety of devices that will support and electrically contact the door along the front of the enclosure.

The Canister and Associated Track Components—FIGS. 4 thru 8

Figure 5:
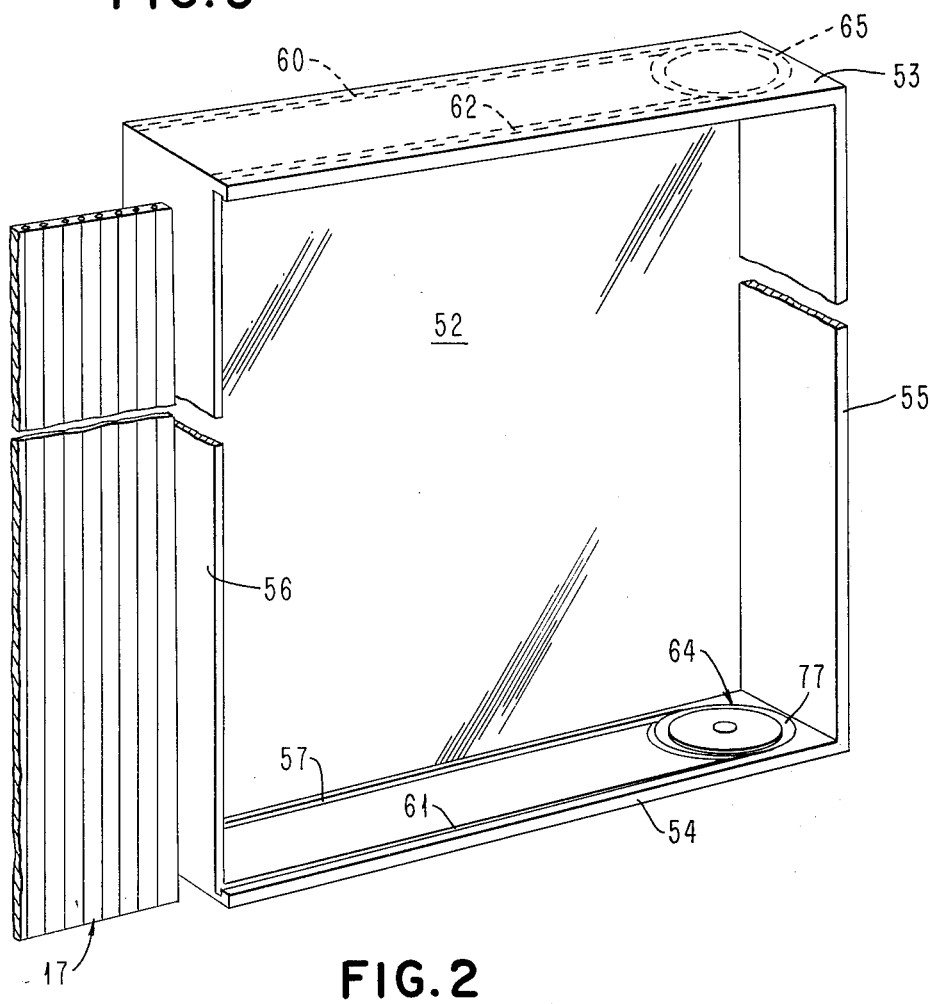
FIG. 5 is a perspective view of the canister.

FIG. 5 shows the canister viewed from the side of the canister that faces the enclosure. It is a generally rectangular box shape with a front 52, top 53, bottom 54, outer side 55, and inner side walls 56 and with an open back facing the process enclosure and providing access to the canister itself. A portion of the associated door 17 is shown as a reference. (The door can easily be removed as shown for maintenance.) The inner surfaces of the top and bottom walls 53, 54 carry a U shaped track having lengths 59, 60 along the back edge, lengths 61, 62, along the front edge and having connecting half-circular portions 64, 65.

Figure 7:
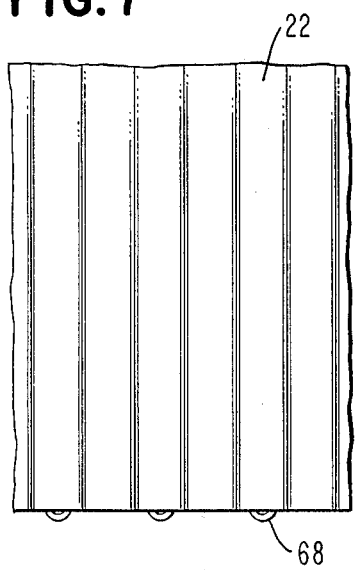
FIG. 7 is a partial front elevation of the tambour door showing supporting wheels.

When the door is moved from the closed position in FIG. 1 to the open position, it slides along the U shaped track system that can be seen in FIG. 5. The curved portion 64, 65 of the track system can be made in either of two general forms. In the tambour door structure of FIG. 7, the door is carried by wheels 68 that ride in the groove 47 of the track. The wheels are preferably carried on small inserts that are forced into the ends of the tambour elements. Wheels may be located on alternate tambour elements as shown in FIG. 7 with wheels on the first two innermost elements to aid moving from the edge of track portion 59 of the canister to the fixed portion 20 of the track system. For a door that is carried by wheels, the half circular track section 64 can be a simple continuation of the track sections 59, 61 with an inner circular or half circular element 70 forming an inner track wall 71 and an edge 72 of the canister floor 54 forming a complimentary outer track wall. Element 70 may be stationary (preferably) or may be rotatable about a shaft 75 that is mounted on the floor wall 54.

In an alternate construction, the tambour elements do not carry the wheels of FIG. 7 but instead the door slides along track portions 59, 61, 64. The door may be supported on small plastic inserts carried by the tambour elements. To carry the door smoothly around the half circular track portion 64, the part 70 is made rotatable as already described, and it carries a circular flange 77 (see FIG. 4) that supports the door. The upper track half circular portion 65 may be constructed with a part 76 arranged to rotate in the same way as the lower part 70, as is shown in FIG. 4. Alternatively, with either the rotating or non-rotating structure of the lower track portion, the upper track can be non-rotating.

Notice that the tambour elements of approximately the inner half of the door do not enter the curved part 64, 65 of the track. These elements are supported at all times by the stationary straight track sections 19, 20 or by the straight inner sections 61, 62 of the canister track. Accordingly, these sections can be attached to a common supporting plate or otherwise formed as a unitary structure with, preferably, the outer appearance of tambour elements.

Figure 8:
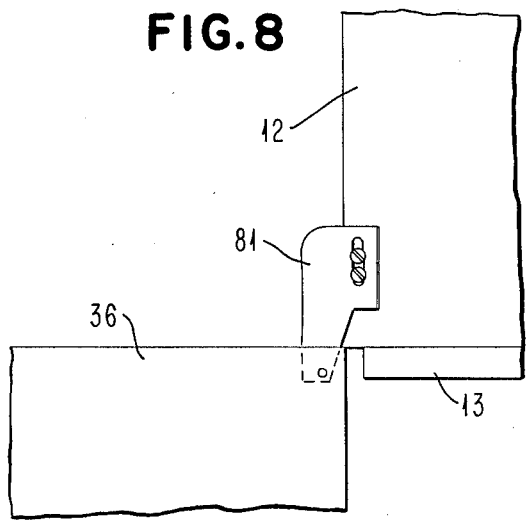
FIG. 8 is a plan view showing the hinge connection between canister and the processor enclosure frame.

FIG. 8 shows a preferred hinge 81 that attaches to the enclosure frame (not shown) and supports the canister 37 to swing away from the front of the enclosure.

Figure 9:
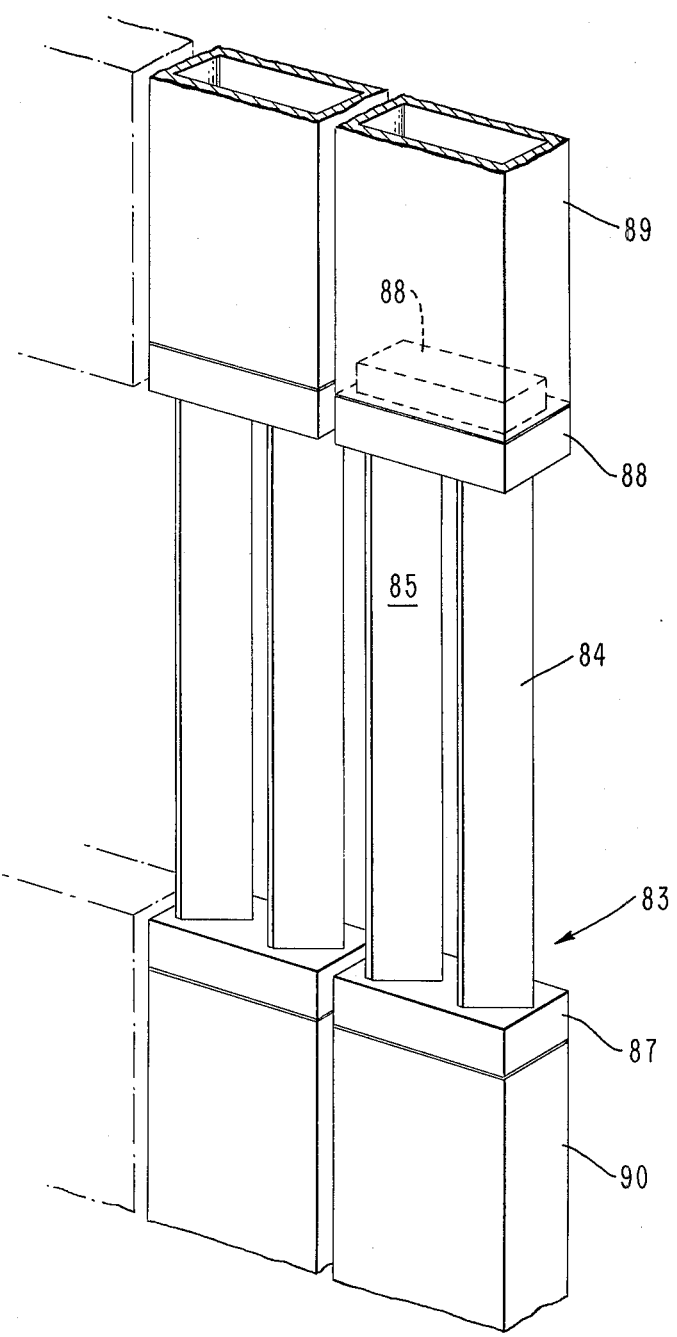
FIG. 9 is a perspective of the tambour elements combined with louver elements.
Figure 10:
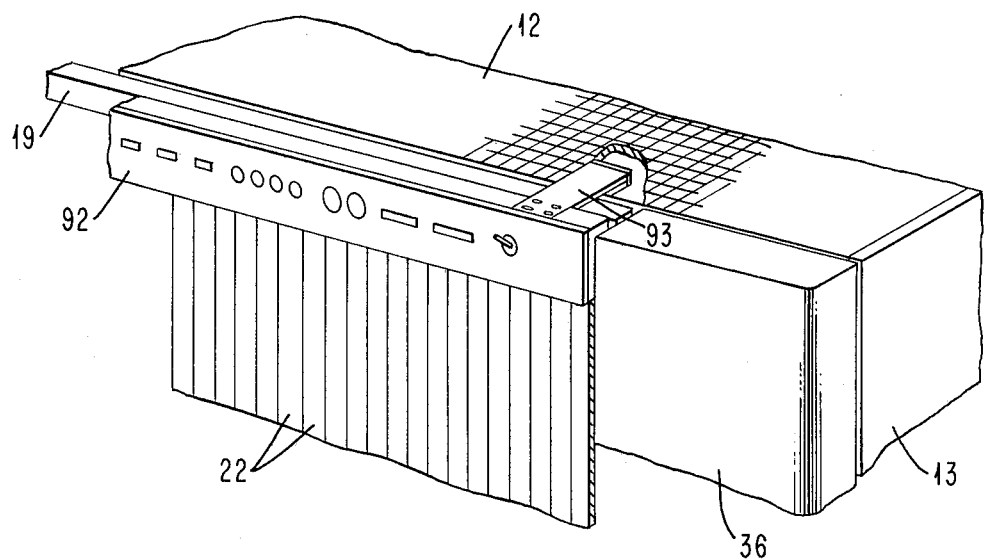
FIG. 10 is a partial perspective of one control panel for the processor enclosure of FIG. 1.
Figure 11:
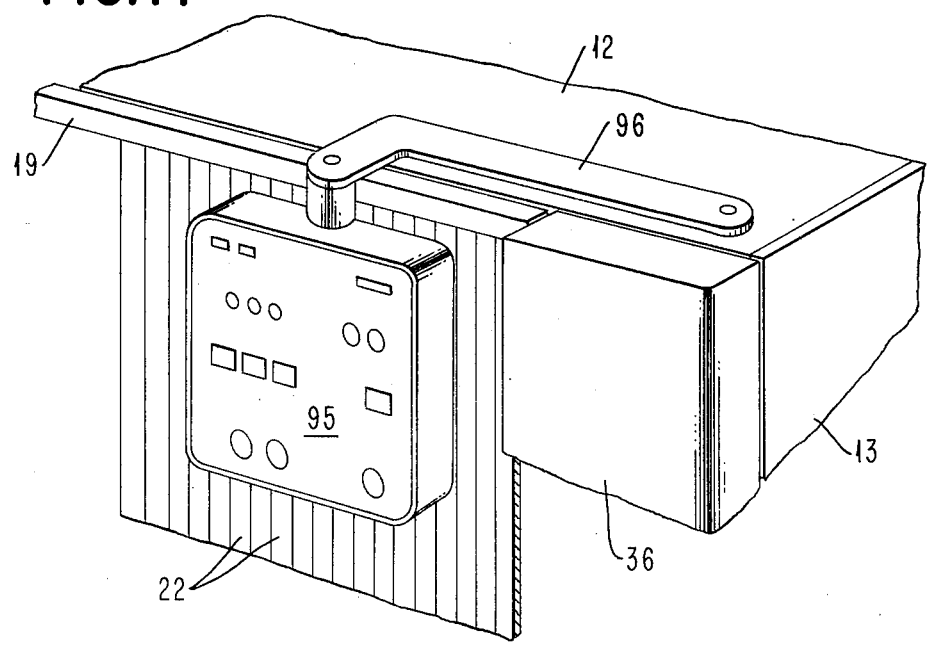
FIG. 11 is a partial perspective of a second control panel for the processor enclosure of FIG. 1.

Other Features FIGS. 9–11

In the conventional construction of processor enclosures that is represented by the flat end panel 13 in FIG. 1, the flat panels sometimes carry louvers for circulating cooling air and they sometimes support switches and indicators. The end panel 13 can be adapted to provide these conventional functions or these functions can be provided in combination with the tambour door as shown in FIGS. 9, 10 and 11.

FIG. 9 shows a structure 83 of two louver elements 84, 85 that are mounted on an upper base 86 and a lower base 87 to fit into an upper section 89 and a lower section 90 of a tambour element. These sections can be made as long as desired and can be located at any suitable place in the tambour door. For example, louver elements about six inches high can be located completely across the bottom of each door. (In FIG. 9 the tambour elements are shown schematically and the hinge structure of FIG. 2 has been omitted.)

It will ordinarily be undesirable to locate switches and indicators on the tambour door itself because a relatively long cable would be required to move with the door. FIG. 10 shows a control panel element 92 that is supported by a hinge 93 at each end in an operating position extending along the top of the enclosure between the two canisters and in front of the upper track 19 as is shown in FIG. 10 to swing into a position over the top of the enclosure to permit complete access to the interior of the enclosure. A short cable (not shown) connects the panel to apparatus inside the enclosure. The drawing shows the conventional egg crate structure of the enclosure top 12 cut away to receive the hinge 93 (and partly broken away to shown the details of the hinge mounting) flush with the top.

An alternative panel 95 is shown in FIG. 11. The panel 95 is pivotally supported on an arm 96 that is pivotally supported on the processor frame. The panel can normally be positioned in front of a door to not project significantly beyond the front edge of the canisters. The panel can be pivoted out of the way for access to the front of the enclosure and it can be pivoted into a position over the end wall 13 when this position is advantageous to service personnel.

This processor enclosure is adaptable to common construction techniques that are used for present day processor enclosures and the details of construction have generally been omitted where conventional techniques apply directly. For example, the electromagnetic sealing gaskets that are conventionally used with panels such as end panel 13 can be used to provide an electromagnetic seal between the canister and the associated frame. A wide variety of specific components can be used in the enclosure and variations within the scope of the claims will be readily apparent to those skilled in the art.

Having thus described our invention, what we claim as new, and desire to secure by Letters Patent is:

1. A processor enclosure of the type having a supporting frame and a relatively wide front with an opening for access to apparatus within the enclosure, wherein the improvement comprises, a horizontally slideable door having a horizontal length to cover a predetermined portion of said opening when the door is closed, first stationary track means mounted along the top and bottom of the frame to support the door along said predetermined portion of said opening, a canister extending horizontally along the opening from approximately one end of the stationary track means to a vertical corner edge of the enclosure, the portion of the opening covered by the door being approximately twice the portion covered by the canister, and means for pivoting the canister at the edge of the enclosure to swing between an open position and a closed position, a second track means mounted in the canister and having a length in a U shape to receive said door completely within the canister and separated from said first stationary track means when the door is open and to receive an edge of the door to provide a seal when the door is closed, a first portion of said U shaped track being aligned with said stationary track means, said door having a vertical tambour structure that is flexible at least in the portion that is moved through the bend in the U shaped track during opening and closing of the door.

2. The enclosure of claim 1 wherein the enclosure comprises first and second of said canisters pivoted at opposite ends of the front of the enclosure and first and second of said tambour doors arranged to meet at a vertical center line at the front of the enclosure when the doors are closed.

3. The enclosure of claim 1 including means formed in the canister to provide two parallel track sections along the front and the back of the canister and means forming a half circular track portion connecting the two parallel track portions comprising a rotatable element having a cylindrical surface forming an inner wall of the track and a flange forming the bottom wall of the track for carrying the door around the half circular portion of the track.

4. The enclosure of claim 1 further including a support for switches and indicators and means mounting the support to move between a position in front of the tambour door and a position away from the front of the enclosure.

5. The enclosure of claim 4 wherein the support for switches and indicators includes means for swinging the support horizontally from the front of the enclosure to an adjacent end of the enclosure.

6. The enclosure of claim 1 wherein the processor has a back opening and a tambour door and canister structure similar to the front opening and front door and canister structure.

7. The enclosure of claim 2 wherein the processor has a back opening and two tambour door and canister structures similar to the front opening and first and second tambour door and canister structures.

* * * * *